(12) United States Patent
Li et al.

(10) Patent No.: US 8,021,945 B2
(45) Date of Patent: Sep. 20, 2011

(54) BOTTLE-SHAPED TRENCH CAPACITOR WITH ENHANCED CAPACITANCE

(75) Inventors: Xi Li, Somers, NY (US); Russell H. Arndt, Fishkill, NY (US); Kangguo Cheng, Guilderland, NY (US); Richard O. Henry, Newburgh, NY (US); Jinghong H. Li, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 12/423,242

(22) Filed: Apr. 14, 2009

(65) Prior Publication Data

US 2010/0258904 A1   Oct. 14, 2010

(51) Int. Cl.
*H01L 21/8242* (2006.01)
(52) U.S. Cl. .................. 438/243; 438/386; 438/964
(58) Field of Classification Search .................. 438/243, 438/386, 964
See application file for complete search history.

(56) References Cited

U.S. PATENT DOCUMENTS

| | | | |
|---|---|---|---|
| 6,025,225 A | 2/2000 | Forbes et al. | |
| 6,037,620 A | 3/2000 | Hoenigschmid et al. | |
| 6,153,474 A | 11/2000 | Ho et al. | |
| 6,171,872 B1 | 1/2001 | Lowrey et al. | |
| 6,177,696 B1 | 1/2001 | Bronner et al. | |
| 6,190,988 B1 | 2/2001 | Furukawa et al. | |
| 6,200,873 B1 | 3/2001 | Schrems et al. | |
| 6,232,171 B1 | 5/2001 | Mei | |
| 6,271,079 B1 | 8/2001 | Wei et al. | |
| 6,291,289 B2 | 9/2001 | Rhodes et al. | |
| 6,365,485 B1 | 4/2002 | Shiao et al. | |
| 6,391,712 B2 | 5/2002 | Ji | |
| 6,440,792 B1 | 8/2002 | Shiao et al. | |
| 6,448,131 B1 * | 9/2002 | Cabral et al. | 438/243 |
| 6,555,430 B1 | 4/2003 | Chudzik et al. | |
| 6,566,177 B1 | 5/2003 | Radens et al. | |
| 6,713,341 B2 | 3/2004 | Chen et al. | |
| 6,806,138 B1 | 10/2004 | Cheng et al. | |
| 6,828,191 B1 | 12/2004 | Wurster et al. | |
| 6,846,744 B1 | 1/2005 | Chen | |
| 6,849,529 B2 | 2/2005 | Lee et al. | |
| 6,867,089 B2 | 3/2005 | Chen et al. | |
| 6,872,621 B1 | 3/2005 | Wu | |
| 6,977,227 B2 | 12/2005 | Lin et al. | |
| 6,989,561 B2 | 1/2006 | Lin et al. | |

(Continued)

*Primary Examiner* — Thien F Tran
(74) *Attorney, Agent, or Firm* — Daryl K. Neff; Joseph Petrokaitis

(57) ABSTRACT

In accordance with an aspect of the invention, a method is provided for fabricating a semiconductor chip including a trench capacitor. In such method, a monocrystalline semiconductor region can be etched in a vertical direction through an opening in a dielectric layer to form a trench exposing a rough surface of monocrystalline semiconductor material. The trench has an initial lateral dimension in a first direction transverse to the vertical direction. The semiconductor material exposed at the surface of the trench then is etched in a crystallographic orientation-dependent manner to expose a multiplicity of crystal facets of the semiconductor material at the trench surface. A dopant-containing liner may then be deposited to line the surface of the trench and a temperature of the substrate then be elevated to drive a dopant from the dopant-containing liner into the semiconductor region adjacent to the surface. During such step, typically a portion of the semiconductor material exposed at the wall is oxidized. At least some of the oxidized portion is removed to expose a wall of an enlarged trench, along which wall a dielectric layer and conductive material are formed in order to form a trench capacitor.

14 Claims, 6 Drawing Sheets

U.S. PATENT DOCUMENTS

| | | |
|---|---|---|
| 7,009,238 B2 | 3/2006 | Lee et al. |
| 7,084,451 B2 | 8/2006 | Forbes et al. |
| 7,101,768 B2 | 9/2006 | Settlemyer, Jr. et al. |
| 7,112,505 B2 | 9/2006 | Wu |
| 7,115,934 B2 | 10/2006 | Cheng et al. |
| 7,122,439 B2 | 10/2006 | Kwon et al. |
| 2006/0228864 A1 | 10/2006 | Chen et al. |

* cited by examiner

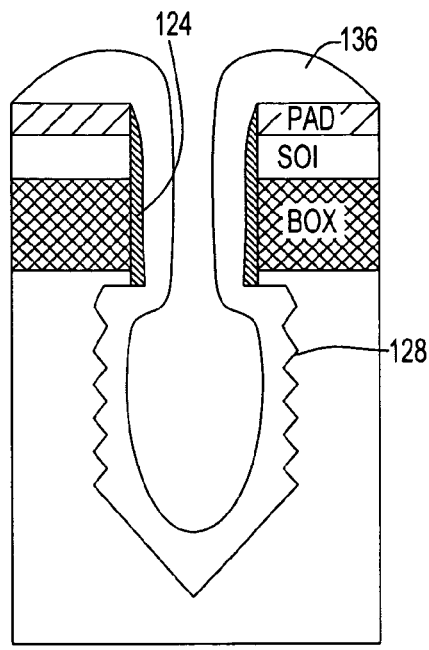
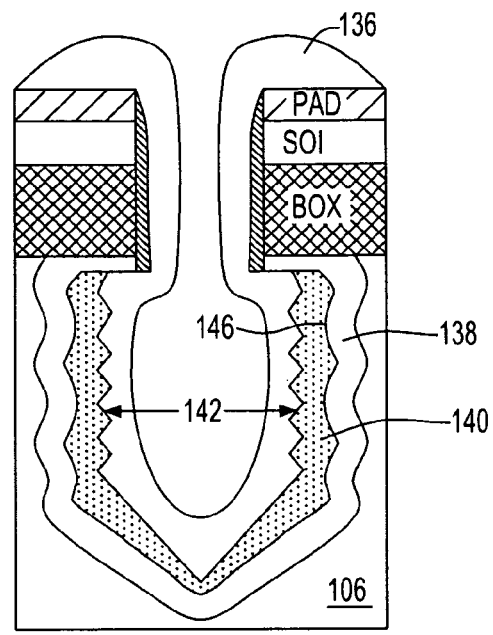
FIG. 5          FIG. 6
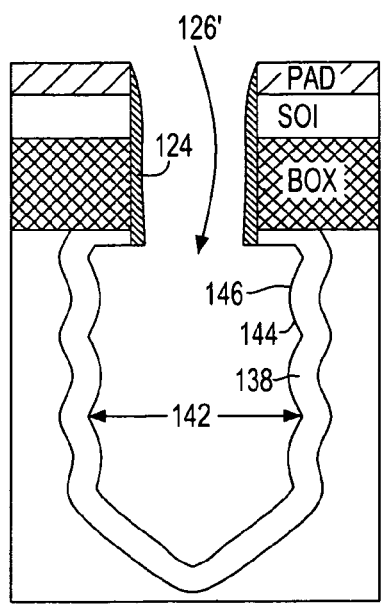
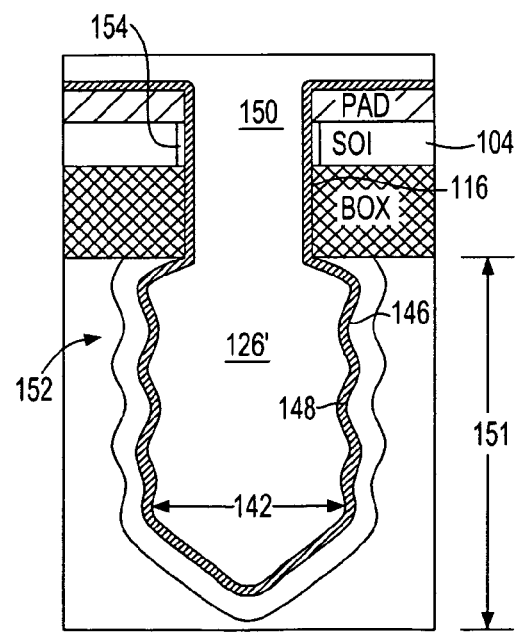
FIG. 7          FIG. 8

BOTTLE-SHAPED TRENCH CAPACITOR WITH ENHANCED CAPACITANCE

BACKGROUND OF THE INVENTION

1. Field of the Invention

The present invention relates to semiconductor devices and their manufacture, and more specifically to a structure and method of making a semiconductor chip having a trench capacitor.

2. Description of the Related Art

One of the challenges of fabricating capacitors within the active device regions of semiconductor chips is to obtain sufficient capacitance while minimizing the area of the active semiconductor device layer occupied by the capacitor. One known way to reduce the semiconductor device area occupied by the capacitor is to use a trench capacitor. A trench capacitor has length extending in a vertically downward direction with respect to the semiconductor device layer, so that the long dimension of the trench capacitor extends out of the plane in which the semiconductor device layer extends.

A known way of increasing capacitance is to form the trench capacitor using a "bottle" process. In such process, first a relatively narrow trench is formed that extends through the active semiconductor device layer. Then, subsequent processing applied to a lower portion of the trench underlying the active semiconductor device layer to enlarge the lower portion of the trench, thus forming a capacitor having a larger surface area and capacitance.

Still further improvements in the fabrication and structure of a trench capacitor would be desirable.

SUMMARY OF THE INVENTION

In accordance with an aspect of the invention, a method is provided for fabricating a semiconductor chip including a trench capacitor. In such method, a monocrystalline semiconductor region can be etched in a vertical direction through an opening in a dielectric layer to form a trench having a rough-surfaced wall of exposed semiconductor material. The trench has an initial lateral dimension in a first direction transverse to the vertical direction. The rough-surfaced wall of the trench then is etched in a crystallographic orientation-dependent manner to expose a multiplicity of crystal facets of the semiconductor region at the trench wall. A dopant-containing liner may then be deposited to line the wall of the trench and a temperature of the substrate then be elevated to drive a dopant from the dopant-containing liner into the semiconductor region adjacent to the trench wall. During such step, typically a portion of the semiconductor material exposed at the trench wall is oxidized.

Subsequently, the dopant-containing liner and at least some of the oxidized portion of the semiconductor material can be removed to expose a wall of an enlarged trench within the semiconductor region. The enlarged trench can have an enlarged lateral dimension relative to the initial lateral dimension. The enlarged trench can have a roughness in accordance with the multiplicity of crystal facets, and have smoothed edges which correspond to the boundaries between the crystal facets. The oxidation of the semiconductor region and removal of the oxide layer therefrom has an effect of smoothing sharp edges and corners at boundaries between the crystal facets. A node dielectric layer can then be formed adjacent to the surface of the enlarged trench and a layer of conductive material be formed adjacent to the node dielectric layer to form a trench capacitor.

In accordance with a particular aspect of the invention, the semiconductor region can be a bulk semiconductor region of a substrate and the substrate can include a monocrystalline silicon layer and a buried oxide ("BOX") region separating the silicon layer from the bulk semiconductor region. The process of etching the monocrystalline silicon region can include etching an opening in the silicon layer and the BOX region and forming a dielectric layer lining a wall of the opening.

In accordance with another aspect of the invention, a semiconductor chip is provided which includes a trench capacitor. In accordance with such aspect, a trench can extend within a monocrystalline semiconductor region and have an enlarged lateral dimension relative to a lateral dimension of the trench at a mouth of the trench. The trench can have a rough surface in accordance with a multiplicity of crystal facets exposed at the surface, the surface also having smoothed edges at boundaries between the crystal facets. A node dielectric layer of the trench capacitor can be disposed adjacent to the surface of the enlarged trench and a layer of conductive material adjacent to the node dielectric layer.

BRIEF DESCRIPTION OF THE DRAWINGS

FIG. 5 is a sectional view illustrating a stage in a method of fabricating a trench capacitor in accordance with an embodiment of the invention subsequent to the stage illustrated in FIG. 4.

FIG. 6 is a sectional view illustrating a stage in a method of fabricating a trench capacitor in accordance with an embodiment of the invention subsequent to the stage illustrated in FIG. 5.

FIG. 7 is a sectional view illustrating a stage in a method of fabricating a trench capacitor in accordance with an embodiment of the invention subsequent to the stage illustrated in FIG. 6.

FIG. 8 is a sectional view illustrating a stage in a method of fabricating a trench capacitor in accordance with an embodiment of the invention subsequent to the stage illustrated in FIG. 7.

DETAILED DESCRIPTION

Figure 1:
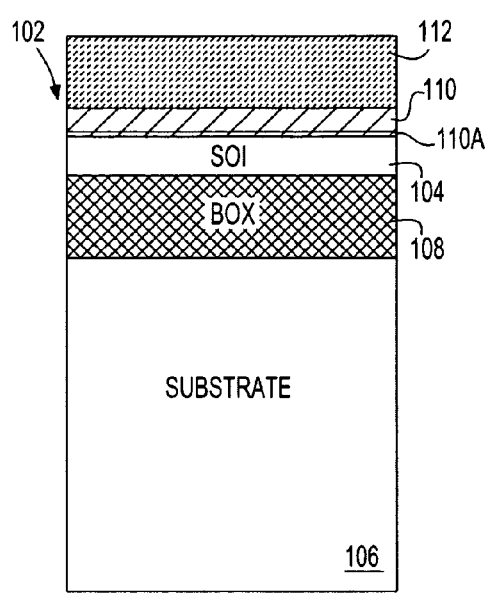
FIG. 1 is a sectional view illustrating a stage in a method of fabricating a trench capacitor in accordance with an embodiment of the invention.

FIG. 1 is a sectional view illustrating a stage in a method in accordance with an embodiment of the invention of fabricating a semiconductor chip containing a trench capacitor. As illustrated in FIG. 1, a silicon-on-insulator ("SOI") substrate 102 includes a monocrystalline silicon layer ("SOI layer") 104 separated from a bulk semiconductor layer 106 by a buried oxide ("BOX") layer 108. A pad dielectric layer 110 and a hard mask layer 112 can be disposed atop the SOI substrate. The pad dielectric layer 110 typically includes a pad layer of silicon nitride and may also include a pad layer of silicon oxide 110A underlying the pad nitride. The hard mask layer 112 typically includes a silicon oxide layer. Besides silicon, the SOI layer may include other semiconductor materials, including but not limited to, germanium, silicon germanium, a compound semiconductor, such as a semiconductor material formed by a compound of a Group III element with a Group V element (gallium arsenide) or a compound of a Group II element with a Group VI element, or any combination of those materials. The SOI layer 104 may have the same crystalline orientation as the semiconductor layer 106 or may have a different crystalline orientation.

Figure 2:
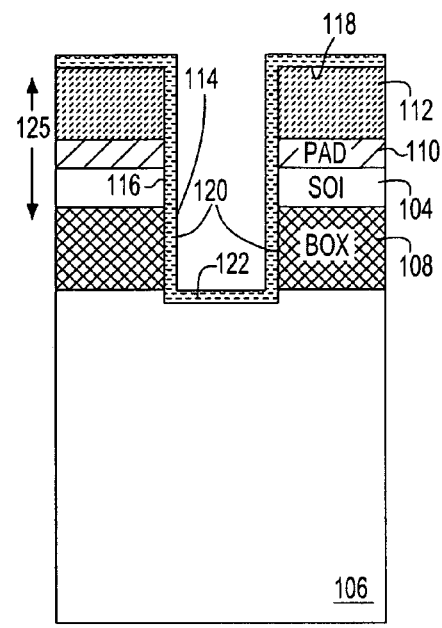
FIG. 2 is a sectional view illustrating a stage in a method of fabricating a trench capacitor in accordance with an embodiment of the invention subsequent to the stage illustrated in FIG. 1.

As illustrated in FIG. 2, an opening is now formed which extends through the hard mask 112, pad dielectric 110, the silicon layer 104 and the BOX layer 108 to expose a surface of the bulk semiconductor region 106 underlying the BOX layer. The opening can be formed by any suitable method such as lithography and a directional etch (e.g., reactive ion etch). A dielectric layer 114 is formed which lines a wall 116 of the opening. In one embodiment, the dielectric layer 114 is formed by depositing silicon nitride onto the wall 116 of the opening and onto an exposed surface 118 of the hard mask layer 112. As seen in FIG. 2, the dielectric layer 114 has walls 120 extending in a vertical direction 125 along the wall 116 of the silicon layer 104 and the dielectric layer has a bottom 122 extending in a direction transverse to the vertical direction.

Figure 3A:
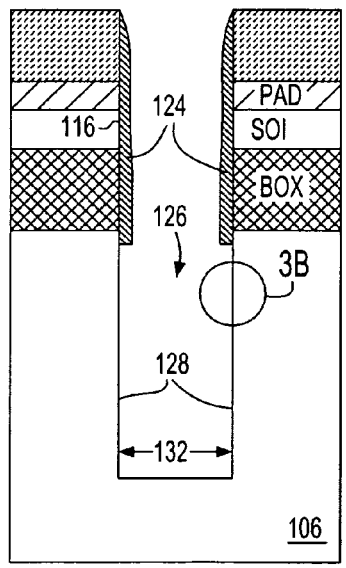
FIG. 3A is a sectional view illustrating a stage in a method of fabricating a trench capacitor in accordance with an embodiment of the invention subsequent to the stage illustrated in FIG. 2.
Figure 3B:
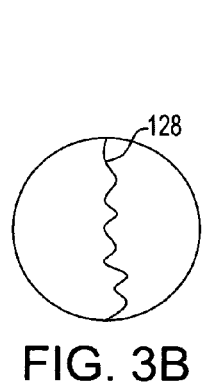
FIG. 3B is an enlarged sectional view illustrating in detail a surface of a trench corresponding to the stage of fabrication shown in FIG. 3A.

Subsequently, a reactive ion etch ("RIE") process, which includes ion bombardment, is performed, which forms an opening extending through the bottom 122 of the dielectric layer 114 and expose the underlying bulk semiconductor region 106 (FIG. 3A). As a result, vertically extending spacers 124 are formed from the remains of the dielectric layer 114 (FIG. 2) along the walls 116. The same RIE process is continued to remove semiconductor material from the bulk semiconductor region 106 aligned with the opening in the dielectric layer to form a trench 126. The ion bombardment during the RIE process results in a wall 128 of the trench having much surface roughness, as particularly seen in the enlarged view of the wall 128 provided in FIG. 3B. At this stage of fabrication, the surface roughness typically ranges between about 1 nanometer and 10 nanometers root mean square (rms).

Figure 4:
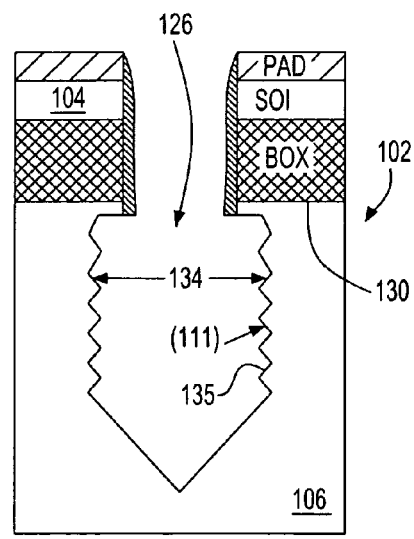
FIG. 4 is a sectional view illustrating a stage in a method of fabricating a trench capacitor in accordance with an embodiment of the invention subsequent to the stage illustrated in FIG. 3.

Thereafter, as illustrated in FIG. 4, an etch process is performed to etch the rough-surfaced wall of the trench 126 in a manner which depends upon the orientation of crystallographic planes within the bulk semiconductor region 106. For example, the crystallographic orientation-dependent etch can be achieved by using a wet etch solution containing ammonia. As a result of such etch process; crystal facets 135 of the semiconductor material therein become exposed. In addition, the etch process can enlarge the trench 126 from an initial lateral dimension 132 (FIG. 3A) after the initial RIE etch to a larger lateral dimension 134. The remaining hard mask layer can be removed at this stage or later.

In a semiconductor substrate 102 in which a major surface 130 of the bulk semiconductor region 106 is in the <100> crystal orientation, the etch process exposes a multiplicity of crystal facets 135 of the bulk semiconductor region 106, such as facets 135 in the <111> crystallographic orientation. With an etch process highly dependent upon the crystallographic plane of the material, etching stops once facets 135 aligned with the <111> plane of the crystal become exposed.

However, the exposed crystal facets have sharp edges and corners where the facets meet. If they were allowed to remain, the sharp edges and corners could be a source of problems in a capacitor formed along a surface of the wall 128. High electric fields could result at the sharp edges and corners, leading to localized dielectric breakdown, and ultimately, increased leakage current and decreased reliability of the capacitor. Subsequent processing reduces, if not eliminates the sharp edges and corners before a capacitor dielectric layer is formed to extend along the wall 128.

Subsequently, a dopant source layer 136 (FIG. 5) is formed to overlie the exposed wall 128 and spacer 124. Typically, the dopant source layer includes or consists at least essentially of doped oxide such as arsenic-doped silicate glass ("ASG"). As illustrated in FIG. 6, a dopant drive-in anneal is performed, in which the substrate with the dopant source layer thereon is heated to a high temperature sufficient to drive the dopant from the dopant source layer 136 into the bulk semiconductor region 106 adjacent thereto. Typically, the temperature is similar to a temperature used to anneal the substrate following an ion implant step. For example, an anneal can be performed at a temperature between about 750 and 1300° C. for a period of time between about 30 seconds and 30 minutes. As a result, a doped region 138 is formed in the bulk semiconductor region 106 surrounding the dopant source layer 136. In addition, the drive-in anneal can be performed in an environment containing a source of oxygen such as water vapor. As a result, a portion of the bulk semiconductor region adjacent to dopant source layer 136 typically is oxidized to form an oxidized portion 140.

Because a portion of the bulk semiconductor region is oxidized and consumed during oxidation, the lateral dimension 142 of the trench is enlarged to an even greater extent than before. The sharp edges and corners, where the crystal facets of the wall meet, oxidize faster than the flat facets between the edges and corners. As a result, the sharp edges and corners are consumed by oxide and become larger radius edges 146 and corners.

As seen in FIG. 7, a process now is performed to remove the oxidized portion 140 of the semiconductor region 106 from overlying the buried plate doped region 138, and with it, the dopant source layer as well, for example, by a wet etch solution containing hydrofluoric acid. The result is a trench 126' having an enlarged lateral dimension 142 larger than the lateral dimension 134 (FIG. 4) of the trench following the etch process illustrated therein. The wall 144 of the semiconductor region 106 has a rough surface due to the exposed facets of the semiconductor region, but in which the sharp edges and corners between the facets of the semiconductor region have been smoothed into larger radius edges 146 and corners. The smoothed, larger radius edges 146 and corners reduce the electric fields which could have occurred at those locations in the finished capacitor, than if the sharp edges and corners had remained in the finished capacitor. Once this stage of fabrication is reached, the surface roughness typically ranges between about 5 nanometers and 25 nanometers rms. The rounded corners and edges between facets have a radius typically ranging between about 2 nanometers and 10 nanometers.

As seen in FIG. 8, steps are performed to complete the trench capacitor 152. The dielectric spacer 124 (FIG. 7) on the wall 116 of the upper portion of the trench can be stripped and a node dielectric layer 148 then formed or deposited on the wall 116 and on the rough-surfaced wall 146 in the lower portion of the trench. After stripping the dielectric spacer 124, optionally, an insulating layer such as a dielectric collar 154 can be formed along a wall of the silicon layer 104 to avoid electrical interaction between the trench capacitor 152 and devices within the silicon layer 104. Node dielectric layer 148 may comprise any dielectric material appropriate for forming a trench capacitor, including but not limited to, silicon oxide, silicon nitride, silicon oxynitride, high-k material having a relative permittivity above about 8, or any combination of these materials. Examples of high-k material include but are not limited to hafnium oxide, hafnium silicon oxide, hafnium silicon oxynitride, aluminum oxide, zirconium oxide, and any combination of these materials. The node dielectric layer 148 may be formed by any suitable method, including but not limited to, thermal oxidation, chemical oxidation, thermal nitridation, atomic layer deposition (ALD), molecular layer deposition (MLD), chemical vapor deposition (CVD), low-pressure chemical vapor deposition (LPCVD), and any combination of those methods.

Subsequently, a conductive electrode material 150 such as a doped polycrystalline semiconductor, a metal, a conductive compound of a metal (e.g., tungsten), a conductive metallic compound (e.g., titanium nitride), or a combination thereof can be deposited onto the node dielectric layer to form a node electrode. The node electrode can fill the trench 126' or the node electrode can line the node dielectric layer 148 along the wall 146. The conductive electrode material 150 may be formed by any suitable method, including but not limited to, atomic layer deposition (ALD), chemical vapor deposition (CVD), low-pressure chemical vapor deposition (LPCVD), and any combination of those methods.

Because the node dielectric layer is formed on a wall 146 of the trench having exposed facets, the wall 146 provides a surface having greater surface area than that of a relatively smooth conventional trench wall. As a result, the trench capacitor 152 can have significantly greater capacitance than a conventional trench capacitor. For example, a capacitor can be obtained which has a capacitance that is more than ten percent greater than that of a conventional trench capacitor having the same lateral dimension 142 and vertical length 151. For example, the increase in capacitance from the process described herein may be more than double the increase in capacitance that results from only enlarging the size of the trench using a bottle process.

Figure 9A:
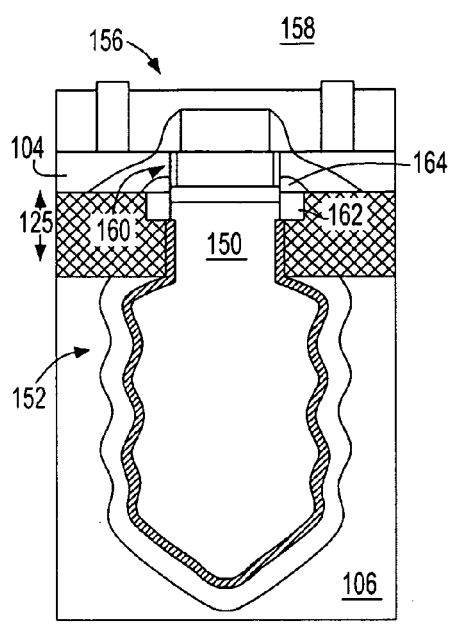
FIG. 9A is a sectional view illustrating a dynamic random access memory ("DRAM") cell including a trench capacitor and a transistor having a vertically-oriented channel region, in accordance with an embodiment of the invention.

Alternatively, as illustrated in FIG. 9A, the trench capacitor 152 can be connected to a transistor 156 having an active semiconductor region in the silicon layer 104. In this way, the trench capacitor can function as the capacitor of a dynamic random access memory ("DRAM") cell 158 including the transistor 156 and trench capacitor 152. In the embodiment seen in FIG. 9, the transistor 156 can have a channel region 160 which is oriented in a vertical direction 125 with respect to the surface of the substrate 106, the transistor being conductively connected to the node electrode 150 by way of a buried strap 162 and buried strap outdiffusion 164.

Figure 9B:
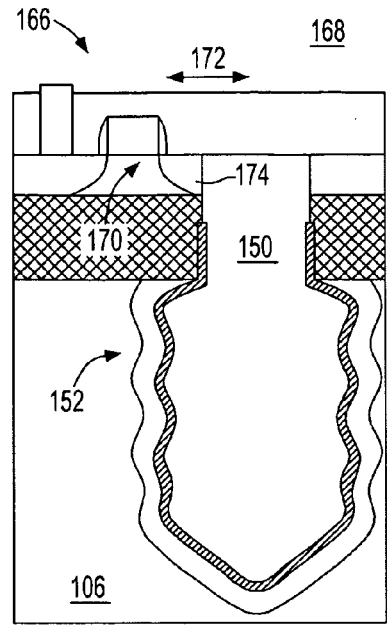
FIG. 9B is a sectional view illustrating DRAM cell including a trench capacitor and a transistor having a horizontally-oriented channel region, in accordance with an embodiment of the invention.

In another variation, as illustrated in FIG. 9B, the trench capacitor 152 can be connected to a planar transistor 166 of a DRAM cell 168, in which the transistor has a channel region 170 oriented in a horizontal direction 172 with respect to the surface of the substrate 106. In this case, the transistor can be conductively connected to the node electrode 150 by way of a buried strap outdiffusion 174. The transistors shown in FIGS. 9A-B are merely illustrative of a great variety of transistor structures and DRAM cell designs which can be fabricated to connect with and operate cooperatively with the trench capacitor shown therein.

Figure 10:
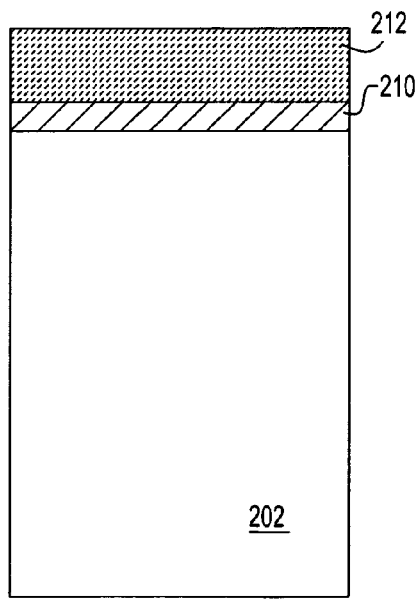
FIG. 10 is a sectional view illustrating a stage in a method of fabricating a trench capacitor in accordance with an embodiment of the invention.
Figure 11:
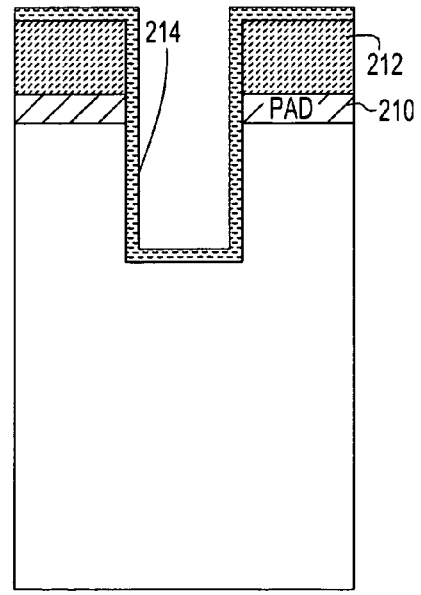
FIG. 11 is a sectional view illustrating a stage in a method of fabricating a trench capacitor in accordance with an embodiment of the invention subsequent to the stage illustrated in FIG. 10.
Figure 12:
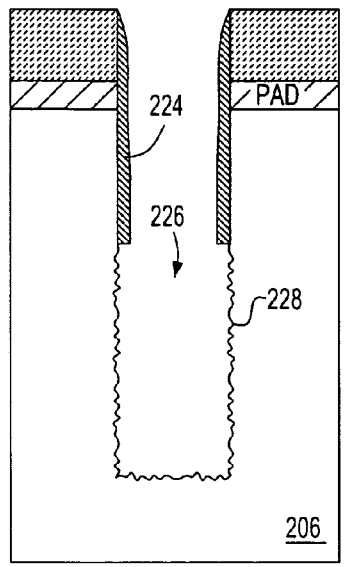
FIG. 12 is a sectional view illustrating a stage in a method of fabricating a trench capacitor in accordance with an embodiment of the invention subsequent to the stage illustrated in FIG. 1.

A variation of the embodiment of the invention illustrated in FIGS. 1-9B will now be described. FIG. 10 illustrates a monocrystalline semiconductor substrate 202 in an initial stage of fabrication, the substrate having a pad dielectric layer 210 thereon and a hard mask layer 212 overlying the pad dielectric layer. The pad dielectric layer may include a layer of silicon nitride overlying a layer of silicon oxide adjacent to the semiconductor substrate, for example FIG. 10 varies with respect to FIG. 1 in that the substrate 202 in FIG. 10 is a bulk monocrystalline semiconductor region rather than a silicon-on-insulator structure as shown in FIG. 10 which has a buried oxide layer. As illustrated in FIG. 11, an opening is formed in the hard mask layer 212 and underlying pad dielectric layer 210, upon a wall of which a dielectric layer 214 then is formed.

Figure 13:
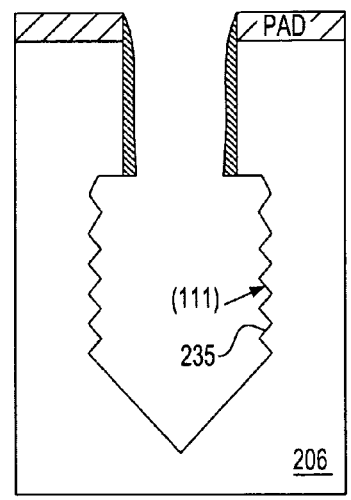
FIG. 13 is a sectional view illustrating a stage in a method of fabricating a trench capacitor in accordance with an embodiment of the invention subsequent to the stage illustrated in FIG. 12.
Figure 14:
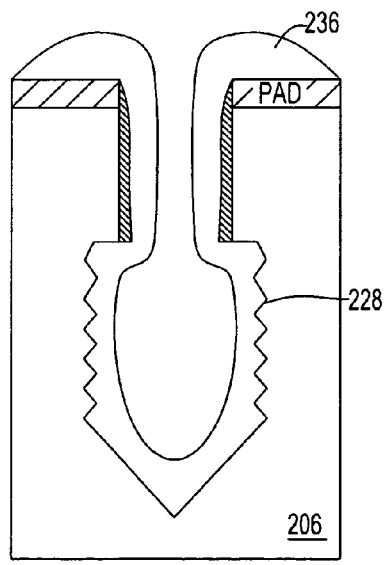
FIG. 14 is a sectional view illustrating a stage in a method of fabricating a trench capacitor in accordance with an embodiment of the invention subsequent to the stage illustrated in FIG. 13.
Figure 15:
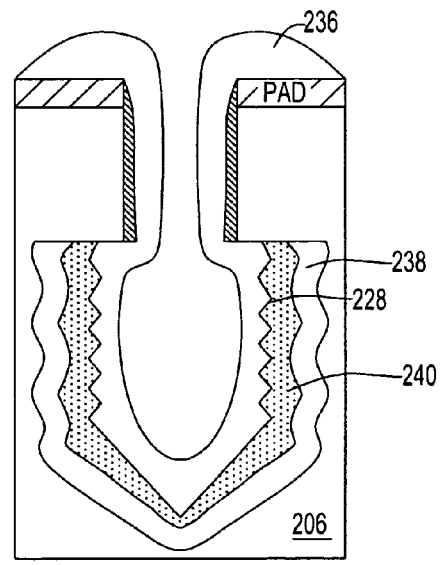
FIG. 15 is a sectional view illustrating a stage in a method of fabricating a trench capacitor in accordance with an embodiment of the invention subsequent to the stage illustrated in FIG. 14.

Except for the lack of a BOX layer and an overlying monocrystalline silicon layer in the substrate overlying the bulk semiconductor region 206, the subsequent series of processing steps illustrated with reference to FIGS. 12 through 17 are the same as those described above with reference to FIGS. 3 to 7. Thus, a trench 226 (FIG. 12) is formed in the bulk semiconductor region 206 below the dielectric spacer 224, the trench having a wall 228 with a rough surface. The rough surface wall then is etched to expose the <111> facets 235 of the semiconductor crystal as shown in FIG. 13. FIG. 14 illustrates a stage of fabrication in which a dopant source layer 236 is formed on a wall 228 of the semiconductor region 206. FIG. 15 illustrates a stage after annealing to drive a dopant contained in the dopant source layer 236 into the semiconductor region 206 to form a buried plate doped region 238 and oxidize a portion of the semiconductor region 206 adjacent to the wall 228 to form an oxide layer 240.

Figure 16:
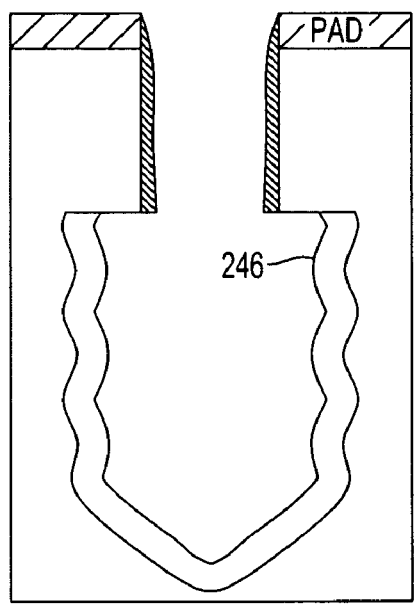
FIG. 16 is a sectional view illustrating a stage in a method of fabricating a trench capacitor in accordance with an embodiment of the invention subsequent to the stage illustrated in FIG. 15.
Figure 17:
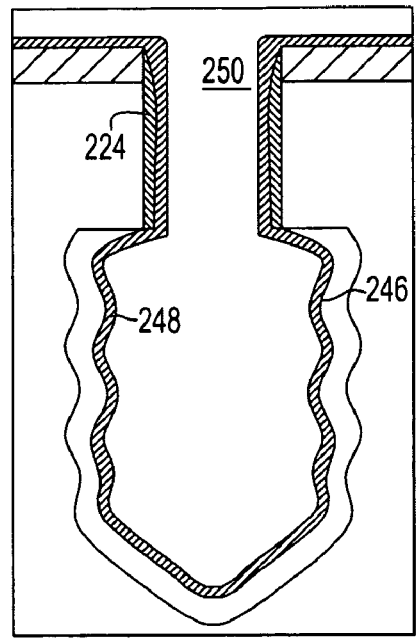
FIG. 17 is a sectional view illustrating a stage in a method of fabricating a trench capacitor in accordance with an embodiment of the invention subsequent to the stage illustrated in FIG. 16.

FIG. 16 illustrates a stage of fabrication after the dopant source layer and oxide layer have been removed to expose the faceted wall 246 of the semiconductor region. With the removal of the oxide layer, the corners and edges between the facets become more rounded, i.e., they have larger radius, such as described above with respect to FIG. 7. FIG. 17 illustrates a stage of fabrication after forming a node dielectric 248 in contact with the exposed faceted wall 246 and a node electrode 250 is formed. As shown in FIG. 17, optionally the dielectric spacer 224 can be left in place as a dielectric collar.

Figure 18:
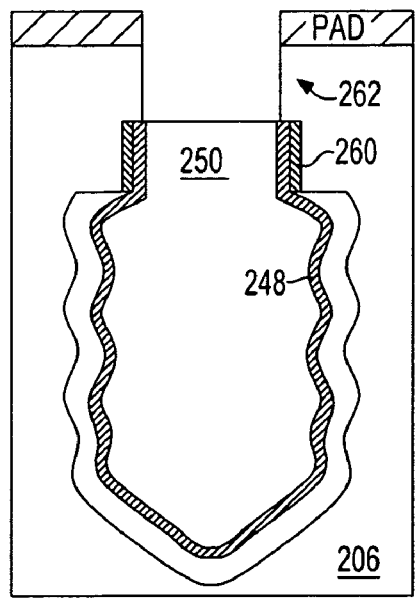
FIG. 18 is a sectional view illustrating a stage in a method of fabricating a trench capacitor in accordance with an embodiment of the invention subsequent to the stage illustrated in FIG. 17.

FIG. 18 shows a stage of fabrication after the spacer, node dielectric 248 and node electrode 250 thereon are recessed to form a collar 260 below an exposed transistor region 262 of the semiconductor region 206.

Figure 19A:
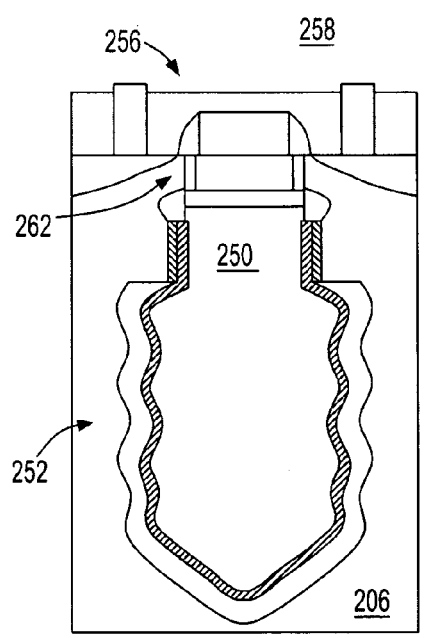
FIG. 19A is a sectional view illustrating a DRAM cell including a trench capacitor and a transistor having a vertically-oriented channel region, in accordance with an embodiment of the invention.

Subsequently, as illustrated in FIG. 19A, a transistor 256 can be formed which has a vertically-oriented channel region in the transistor region 262 of the substrate and having a conductive connection to the node electrode 250 of the trench capacitor. Again, the trench capacitor can function as the capacitor of a dynamic random access memory ("DRAM") cell 258 including the transistor 256 and trench capacitor 252.

Figure 19B:
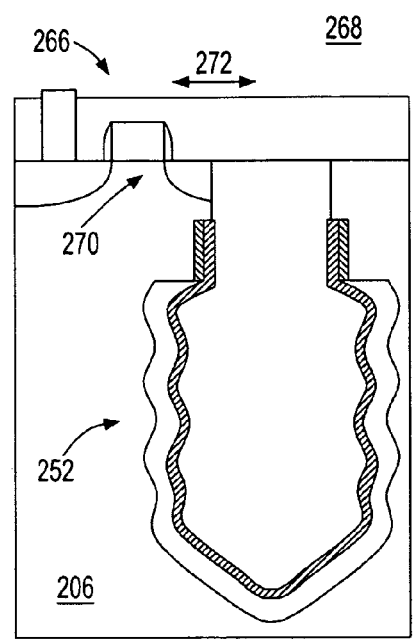
FIG. 19B is a sectional view illustrating DRAM cell including a trench capacitor and a transistor having a horizontally-oriented channel region, in accordance with an embodiment of the invention.

In another variation, as illustrated in FIG. 19B, the trench capacitor 252 can be connected to a planar transistor 266 of a DRAM cell 268, in which the transistor has a channel region 270 oriented in a horizontal direction 272 with respect to the surface of the substrate 206. The transistors shown in FIGS. 19A-B are merely illustrative of a great variety of transistor structures and DRAM cell designs which can be fabricated to connect with and operate cooperatively with the trench capacitor shown therein.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a semiconductor chip including a trench capacitor, comprising:
   a) etching a monocrystalline semiconductor region in a vertical direction through an opening in a dielectric layer to form a trench exposing a rough surface of monocrystalline semiconductor material of the semiconductor region, the trench having an initial lateral dimension in a first direction transverse to the vertical direction;
   b) etching the semiconductor material exposed at the surface of the trench in a crystallographic orientation-dependent manner to expose a multiplicity of crystal facets of the semiconductor material at the trench surface;
   c) elevating a temperature of the substrate to drive a dopant from a dopant-containing liner lining the surface of the trench into the semiconductor region adjacent to the surface and to oxidize at least a portion of the semiconductor material exposed at the wall;
   d) removing the dopant-containing liner and at least some of the oxidized portion of the semiconductor material to expose a wall of an enlarged trench within the semiconductor region, the enlarged trench having an enlarged lateral dimension relative to the initial lateral dimension, having roughness in accordance with the multiplicity of crystal facets and having smoothed edges corresponding to boundaries between the crystal facets; and
   e) forming a node dielectric layer adjacent to the surface of the enlarged trench and a layer of conductive material adjacent to the node dielectric layer so as to form a trench capacitor along the wall of the enlarged trench.

2. A method as claimed in claim 1, wherein the semiconductor region is a bulk semiconductor region and the substrate includes a monocrystalline silicon layer and a buried oxide ("BOX") region separating the silicon layer from the bulk semiconductor region, wherein step (a) includes etching an opening in the silicon layer and the BOX region and forming a dielectric layer lining a wall of the opening.

3. A method as claimed in claim 2, wherein the dopant-containing liner includes a doped glass.

4. A method as claimed in claim 3, wherein the dopant-containing liner includes an arsenic-doped glass.

5. A method as claimed in claim 2, wherein the enlarged lateral dimension is at least 20 per cent greater than the initial lateral dimension.

6. A method as claimed in claim 1, wherein the surface of the semiconductor region adjacent to which the node dielectric is formed has a surface roughness of at least about 5 rms.

7. A method as claimed in claim 1, wherein the drive-in anneal step is performed in an environment containing a source of oxygen.

8. A method as claimed in claim 1, wherein the smoothed edges at boundaries between the crystal facets have a radius of at least about 2 nanometers.

9. A method of fabricating a semiconductor chip including a trench capacitor, comprising:
   a) etching an opening extending through a hard mask layer, a monocrystalline silicon layer and a buried oxide (BOX) layer of a substrate to expose a monocrystalline semiconductor region of the substrate separated from the silicon layer by the BOX layer;
   b) forming a dielectric layer lining a wall and a bottom of the opening;
   c) etching in a vertical direction to form an opening extending through the bottom of the dielectric layer and etching the semiconductor region through the opening in the dielectric layer to form a trench within the semiconductor region exposing a wall of the monocrystalline semiconductor material having a rough surface, the trench having an initial lateral dimension in a first direction transverse to the vertical direction;
   d) etching the semiconductor material at the wall of the trench in a crystallographic orientation-dependent manner to expose a multiplicity of crystal facets of the semiconductor material at the wall;
   e) depositing a dopant-containing liner to line the wall of the trench;
   f) elevating a temperature of the substrate to drive a dopant from within the dopant-containing liner into the semiconductor region adjacent to the wall and to oxidize at least a portion of the semiconductor material exposed at the wall;
   g) removing the dopant-containing liner and at least some of the oxidized portion of the semiconductor material to form an enlarged trench exposing a surface of the semiconductor material of the semiconductor region, the enlarged trench having an enlarged lateral dimension relative to the initial lateral dimension, the surface of the enlarged trench having a surface roughness in accordance with the multiplicity of crystal facets and having smoothed edges corresponding to boundaries between the crystal facets; and h) forming a node dielectric layer adjacent to the surface of the enlarged trench and a layer of conductive material adjacent to the node dielectric layer so as to form a trench capacitor along the wall of the enlarged trench.

10. A method as claimed in claim 9, wherein the dopant-containing liner includes a doped glass.

11. A method as claimed in claim 9, wherein the enlarged lateral dimension is at least 20 per cent greater than the initial lateral dimension.

12. A method as claimed in claim 9, wherein the surface of the semiconductor region adjacent to which the node dielectric is formed has a surface roughness of at least about 5 rms.

13. A method as claimed in claim 9, wherein the smoothed edges at boundaries between the crystal facets have a radius of at least about 2 nanometers.

14. A method as claimed in claim 9, wherein the drive-in anneal step is performed in an environment containing a source of oxygen.

\* \* \* \* \*